United States Patent

Bracha et al.

[11] Patent Number: 5,943,485
[45] Date of Patent: Aug. 24, 1999

[54] METHOD FOR TESTING AND FOR GENERATING A MAPPING FOR AN ELECTRONIC DEVICE

[75] Inventors: Gabriel Bracha, Tel Aviv; Eytan Weisberger, Ramat Hasharon, both of Israel

[73] Assignee: Motorola, Inc., Schaumburg, Ill.

[21] Appl. No.: 08/730,047

[22] Filed: Oct. 15, 1996

[51] Int. Cl.$^6$ .................................................. G06F 11/20
[52] U.S. Cl. ...................................................... 395/500.02
[58] Field of Search ........................... 395/800; 364/488, 364/489, 490, 491

[56] References Cited

U.S. PATENT DOCUMENTS

| | | | |
|---|---|---|---|
| 4,751,656 | 6/1988 | Conti | 364/488 |
| 4,922,432 | 5/1990 | Kobayashi et al. | 364/490 |
| 5,210,701 | 5/1993 | Hana | 364/491 |
| 5,438,681 | 8/1995 | Mensch | 395/800 |
| 5,668,965 | 9/1997 | Matsumoto et al. | 345/352 |

FOREIGN PATENT DOCUMENTS

| | | | |
|---|---|---|---|
| 6-161695 | 6/1994 | Japan | G06F 3/14 |
| 2 251 321 | 7/1992 | United Kingdom | G06F 15/42 |
| 2 271 004 | 3/1994 | United Kingdom | G06F 15/40 |

*Primary Examiner*—Kevin J. Teska
*Assistant Examiner*—Thuan Do
*Attorney, Agent, or Firm*—Bob Handy; Robert D. Atkins

[57] ABSTRACT

In a method for generating a mapping of logical addresses to a layout of an electronic circuit structure first and second relations are established. The first relation is representative of the mapping of signal pairs to the layout and the second relation is representative of the mapping of the logical addresses to the signal pairs. Joining of the first and second relations yields a mapping table which can be used for purposes of circuit testing and design.

6 Claims, 2 Drawing Sheets

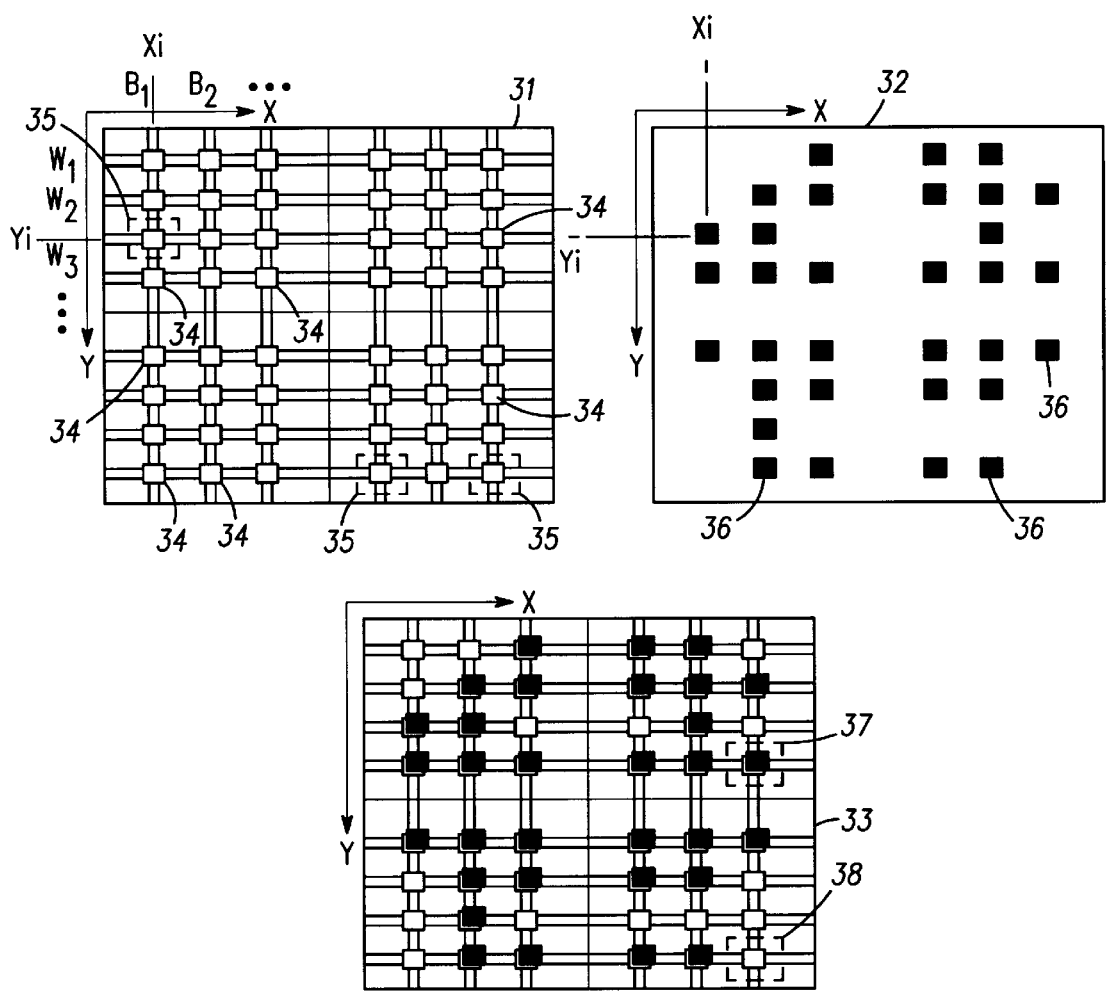
FIG. 3
FIG. 4
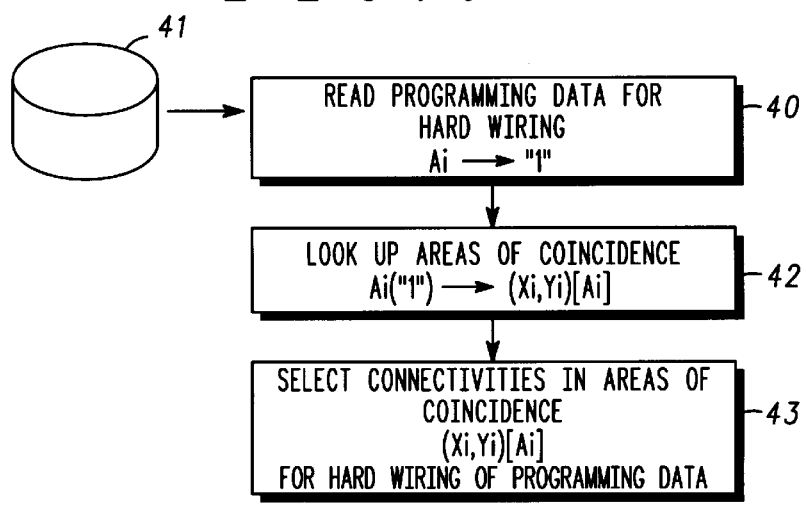

METHOD FOR TESTING AND FOR GENERATING A MAPPING FOR AN ELECTRONIC DEVICE

FIELD OF THE INVENTION

This invention relates generally to the field of electronic circuit structures, and more particularly to test and design methods for such circuit structures.

BACKGROUND OF THE INVENTION

For the design of an electronic circuit device, such as an integrated circuit chip, typically a team of designers creates the logic structure of the electronic device in terms of a so called netlist which describes which cells of the device have to be interconnected. Typically each cell is identified by a unique logical address.

In the physical implementation of the electronic device the logical address has to be translated to a physical address when the cell is to be accessed. By means of the physical address a pair of signals is selected. In the case of a memory device this can be the word and the bit lines of the memory cell to be accessed.

Generally, a specific cell is selected by selecting the appropriate signal pairs which correspond to a physical address. For each signal there is one physical net implemented in the circuit structure of the device. The cell to be accessed is interconnected to both nets which carry the signal pairs. Thus the area of coincidence of these two nets is representative of the physical coordinates of the cell to be accessed in the layout topology.

As a consequence the logical addresses of an electronic device have to be interrelated to the actual physical placement of the corresponding cells in the layout. Usually this is done either by hand coding a program dedicated to a specific electronic device which can not be used for other devices.

An alternative method is to use a special kind of encoder which requires a comprehensive description of the electronic circuitry including design, layout and a read only memory describer. Each time the physical layout is changed, the encoder has to be changed accordingly which requires a lot of coordination between the layout and design groups of the development staff. This is expensive both in terms of development time and money.

Another instance where a mapping of a logical address to the layout is needed is in circuit testing. When an electronic circuit structure is tested, such as an integrated circuit chip, typically a number of automated test procedures is employed which feed a high number of sequences of test data to the circuit and evaluate the result. Thereby defective logical addresses can be found.

The problem encountered in such a test environment is to determine the physical cell in the circuit structure which corresponds to a defective logical address. This can be important for repair purposes of the circuit or to determine the reason for the failure. Also sometimes it is desirable to examine cells which neighbor the defective cell since it can be likely that they are also affected by the defect. Such an analysis requires a dedicated effort of bit mapping program coding in the prior art.

The underlying problem of the invention is therefore to devise an improved method for mapping of logical addresses to a layout as well as an improved test method and electronic device.

SUMMARY OF THE INVENTION

The underlying problem of the invention is solved by applying the features laid down in the independent claims. Preferred embodiments of the invention are set out in the dependent claims.

The invention is particularly advantageous in that it allows to establish a mapping of logical addresses to the layout which relies on two separate relations. The first relation can be derived automatically from layout data whereas the second relation relies on logic design data. Typically the logic design data is immune to layout changes. As a consequence, if the layout changes and the logic design stays the same, only the first relation has to be established again to generate a new mapping table. This can be done fully automatically.

Another advantage of the method of the invention is that the mapping can be done without extensive coordination between different development groups, i.e. logic and layout designer. The two relations needed for the mapping can be established by the two design groups independently from each other before the relations are joined to yield the desired mapping.

BRIEF DESCRIPTION OF THE DRAWING

FIG. 3 is a diagrammatic representation of a portion of a read only memory structure;

FIG. 4 is a flow chart illustrating a method for designing a mask which relies on the method for generating a mapping of logical addresses according to the invention.

With reference to FIG. 1 a first embodiment of a method for generating a mapping according to the invention is explained in greater detail. In step 10 a table 1 is inputted; the table 1 maps logical addresses Ai to signal pairs Wi, Bi. The information required for this mapping is known to the logic design group of the electronic device. For example, if the electronic device is a read only memory each logical address Ai has a corresponding pair of signals which are implemented as word line Wi and bit line Bi in the memory.

Likewise, in logic chips having a large number of different logic cells which are interconnected by a plurality of different nets, each logical address is associated to a pair of nets which carry two different signals. Both signals have to be connected to the cell having the corresponding logical address Ai to select and operate this cell. This means that the topological area of coincidence of the two signals belonging to a logical address on the layout of the electronic device indicates the position of the electronic device on the layout.

In step 12 layout data are inputted. The layout data is descriptive of the circuit topology of the electronic device. It does not contain logical design data, such as the assignment of specific routes, vias or other conducting structures to specific nets or signals. The layout data is only descriptive of the topological structure as such.

If the method according to the preferred embodiment of the invention which is considered here is used for programming an electronic circuit structure by hart wiring, it is advantageous to include optional connectivities in the layout data. For example if the electronic device is a read only memory, which has to be programmed, all optional connectivities which can be used for the hard wiring are included in the layout data.

In step 14 a table 2 is established which maps the signal pairs of the logic design to the layout: The list of signal pairs is known from the logic design. From the layout data another list is generated which is descriptive of the nets contained in the circuitry described by the layout data. This yields a netlist which does not contain the assignment of nets to signals.

By comparison of the logic design data, i.e. the list of signal pairs and their associated netlists, to the netlists which are derived from the layout the layout information and the logic nets can be mapped. As a result, each signal pair is assigned to its corresponding pair of physical nets in the actual layout.

When the cell which is connected to both physical nets is to be selected and operated both nets have to be driven to supply the appropriate signal pair to the cell. Hence, the area of coincidence of the physical nets which is known from the layout data is at the same time the area of coincidence of the relevant signal pairs.

As a consequence, the assignment of each signal pair to a pair of physical nets is at the same time an assignment of each signal pair to topological coordinates Xi, Yi of the layout which define the position of the cell which has the logical address Ai.

In step 16 the tables 1 and 2 are joined. This is done by using the right column in table 1 which contains the signal pairs as a key to the table 2 which contains in its left column also the same signal pairs. The result of the joining operation in step 16 yields a mapping table which maps the logical addresses Ai to the position Xi, Yi of the corresponding cell in the layout of the electronic device.

Figure 2:
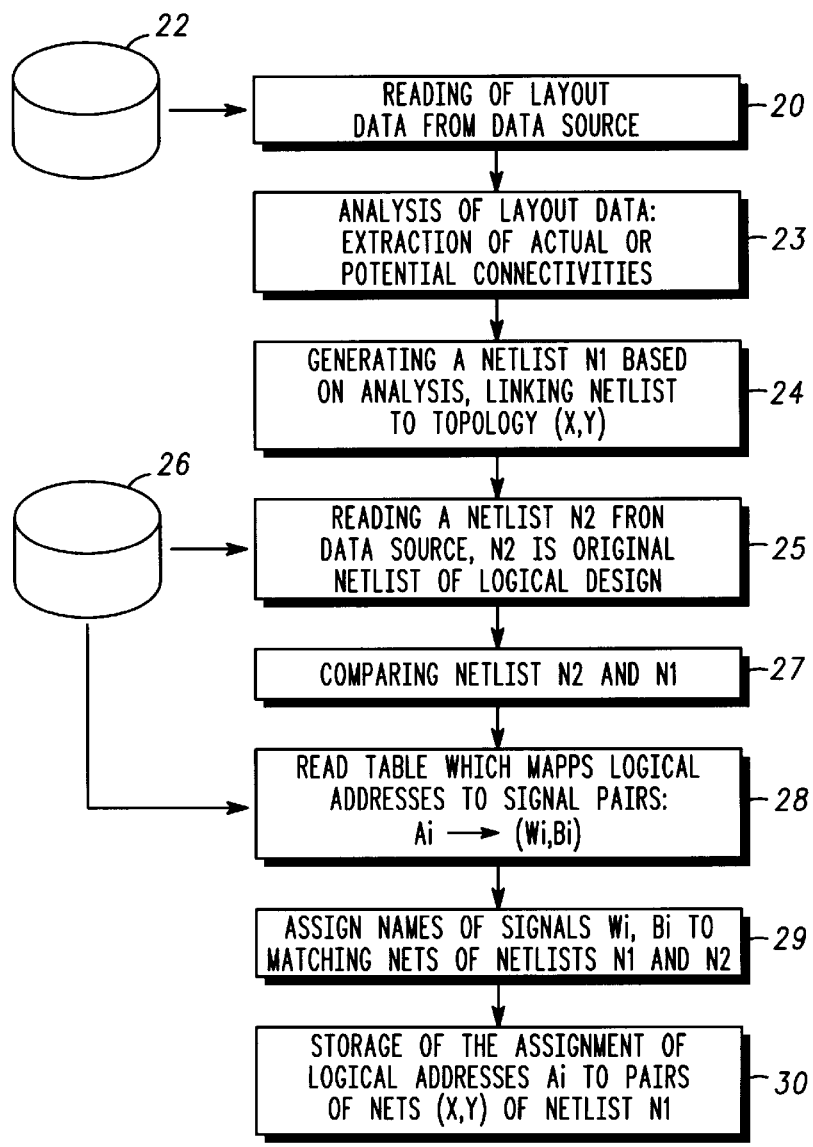
FIG. 2 shows a flow chart of an alternative preferred embodiment of a method for generating a mapping of logical addresses according to the invention.

FIG. 2 shows an alternative preferred embodiment of a method for generating a mapping according to the invention. In step 20 the layout data are read from a data source 22 which can be any type of storage medium such as a tape or other kind of magnetic or optical medium. In step 23 the layout data is analyzed. This is done by extracting the connectivities as described by the layout data which can be actual connectivities as implemented in the physical circuit structure of the device or potential connectivities which can be selected for hard wiring or a mixture of both.

Based on the analysis carried out in step 23 in step 24 a netlist N1 is generated. This netlist is devoid of any data from the logical design and does therefore not contain assignments of the individual nets to the signals of the logical design. Since the netlist N1 is derived from the layout data it is still linked to the topology of the electronic device.

In step 25 netlist N2 is read from data source 26. The netlist N2 is the original netlist of logic design as established by the design group. The two netlists N2 and N1 are compared to each other in step 27. As there is an isomorphism between the netlists N2 and N1 matching nets of both netlists can be found. The matching nets in fact are identical but representative of different aspects of the electronic device: the nets of netlist N2 are descriptive of the logic design, including the signals carried on the net, whereas the nets of the netlist N1 are representative of the circuit layout and topology.

Figure 1:
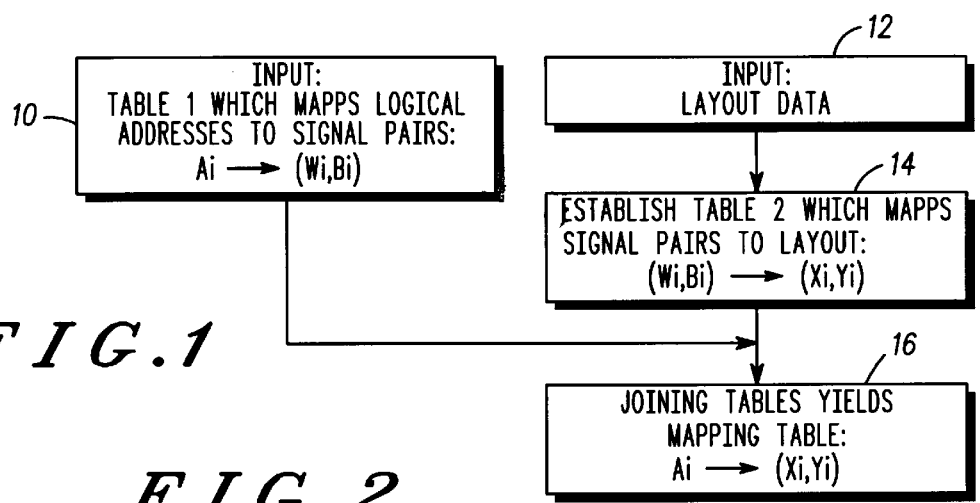
FIG. 1 is a flow chart illustrating a method according to the invention for generating a mapping of logical addresses.

In step 28 a table is read from the data source 26 which maps the logical addresses Ai to the signal pairs Wi, Bi. This is equivalent to step 10 in the embodiment shown in FIG. 1.

In step 29 each signal in the table read in step 28 is assigned to a pair of matching nets of the netlists N1 and N2. Thereby a relation is established between the signal pairs contained in the table read in step 28 and the layout since the netlist N1 is representative of the physical layout. The relation established in step 29 is joined with the table read in step 28 using the signal pairs as keys analogous to the embodiment considered above with reference to FIG. 1. The resulting assignment of logical addresses Ai to pairs of nets Xi, Yi of the netlist N1 is stored in a mapping table.

The mapping table which is established according to the preferred embodiment of the invention as described above can be used for a number of different purposes. For example, it can be used for testing of an electronic circuit structure: If a defective logical address is found in the electronic circuit structure under test, the corresponding physical circuit area has to be identified which corresponds to the defective logical address. The logical address corresponds to the area of coincidence of the signal pairs belonging to that logical address. This area of coincidence is at the same time the area of coincidence of the pair of physical nets which carry this signal pair in the actual electronic circuit structure. Hence, this area of coincidence where the defect occurred can be determined by using the defective logical address as a key for looking up the corresponding spatial coordinates Xi, Yi of the defective cell in the mapping table. The identification of the location of the defect in the electronic circuit structure is of great value for failure analysis and/or repair of the electronic circuit structure.

Another example for applying the mapping table which is found according to the above described preferred embodiments is in the field of encoding read only memory electronic circuit structures (ROM).

FIG. 3 shows an electronic circuit structure 31 which is a so called "ROM plane". A ROM plane represents the unprogrammed ROM. According to the ROM technology which is considered here the cells of the ROM plane contain incomplete or unconnected transistors. A transistor which is connected or completed during the manufacturing process carries the logical information "1" whereas a transistor which remains unconnected or uncompleted carries the logical information "0". The connection or completion of transistors is accomplished by hard wiring, or in other words, by selecting certain optional connectivities in the ROM plane.

In the electronic circuit structure 31 considered in this example these optional connectivities are indicated by blocks having reference numeral 34. Each optional connectivity 34 is situated at the intersection of one of the word lines W1, W2, . . . and B1, B2, . . . . Within each area of coincidence of the word lines Wi and the bit lines Bi a storage cell 35 for storage of one bit of information is to be realized.

Mask 32 contains the so-called ROM code which is determined according to the users ROM program. For a given ROM, the ROM plane is constant whereas the ROM code can be varied according to the users requirements. Superimposing a new ROM code structure on top of a ROM plain structure creates a new programmed ROM.

The black areas 36 in the mask 32 are representative of the required programming of the electronic circuit structure 31. Each area 36 selects one of the optional connectivities 34 to be implemented during the fabrication process. Thereby a logical "1" is programmed in the corresponding cell 35.

The resulting ROM 33 with the superimposed ROM code structure as represented by mask 32 is also shown in FIG. 3. The cells 37 of the resulting ROM 33 which have completed or connected transistors are symbolized by a black box inside the cells 37; the black box covers a corresponding optional connectivity. The cells 38 for which no optional connectivity is implemented are symbolized by the empty boxes like in the original electronic circuit structure 31 since they remain the same. Since no optional connectivity is selected for a cell 38 the corresponding transistor is not connected or completed so that the cell carries a logical "0".

The original electronic circuit structure 31 contains a number of signal pairs Wi, Bi. The area of coincidence of each of the signal pairs in the layout is representative for a cell 35 which has to be connected to a specific pair of signals Wi, Bi. The relation of these pairs of signals to the logical addresses Ai of the electronic circuit structure 31 is known to the team of logic designers. Also the resulting circuit topology of the electronic circuit structure including all optional connectivities 34 is described by special layout data separate from the logical design data.

The layout data is only descriptive of the circuit topology as such but devoid of any assignment of the physical and/or potential wiring structures to any logical signals. If the mapping of the logical addresses Ai to signal pairs Wi, Bi as well as the layout data is inputted and processed according to a method of the invention a mapping of the logical addresses to the layout results. In the preferred embodiments described above a mapping table is generated which contains coordinates Xi, Yi indicating the position of cell 35 in the layout which belongs to the logical address Ai.

From the users ROM program the logical addresses which are to be programmed to be logical "1" are known. In order to hard wire this program in the electronic circuit structure 31 the appropriate connectivities 34 have to be selected. This requires that each of the logical addresses Ai to be programmed logical "1" have to be mapped to their corresponding Xi, Yi coordinates, which are descriptive of the cell which eventually carries the logical information. This mapping can be done by means of the mapping table found in accordance with one of the embodiments of the method of the invention described above. Each logical address Ai to be programmed is used as a key for looking up the mapping table in order to find the corresponding Xi, Yi coordinates. These Xi, Yi coordinates are required to fabricate the mask 32 which has a black area 36 at each location Xi, Yi to implement the appropriate optional connectivities for hard wiring the programming of the ROM 33.

The resulting ROM 33 is tested for defective logical addresses Ai after the manufacturing. If one of the logical addresses Ai should not carry the desired logical information, this logical address is considered to be defective. To repair the ROM 33 and to locate the defect within the physical circuit implementation it is possible to use the same mapping table which was used for the design again: the physical location Xi, Yi is looked up in the table by making usage of the logical address Ai which was found during the test of the ROM 33.

In FIG. 4 an embodiment of a method for designing an electronic circuit structure according to the invention is shown. In step 40 the programming data for the hard wiring is read which is a table containing all the logical addresses Ai which have to carry a logical "1". The programming data is read from data source 41 which can be a magnetic tape or something the like.

In step 42 the areas of coincidence of signal pairs corresponding to the logical addresses to be programmed logically "1" are looked up in the mapping table to find the Xi, Yi coordinates for each logical address Ai to be programmed logically "1".

In step 43 the corresponding connectivities in these areas of coincidence are selected for hard wiring the programming data in the electronic circuit structure.

We claim:

1. A method for generating a mapping of logical addresses to a layout of an electronic circuit structure, each of said logical addresses forming an assignment with one of a plurality of signal pairs, said method comprising the steps of
   a) establishing a first relation between said signal pairs and said layout, said relation being representative of an area of coincidence of said signal pairs on said layout;
   b) establishing a second relation between said logical addresses and said signal pairs, said second relation being representative of said assignment of said logical addresses to said signal pairs, and
   c) joining said first and second relations by using said signal pairs as keys.

2. The method according to claim 1 said step of establishing a second relation comprising the steps of
   b1) reading of layout data from a first data source having data representative of said layout stored therein;
   b2) extracting a first netlist of said electronic circuit structure from said layout data;
   b3) reading a second netlist from a second data source, said second netlist being representative of design data of said electronic circuit structure; and
   b4) establishing an isomorphism between said first and second netlist by comparing said first and second netlist.

3. The method according to claim 1, said electronic circuit structure being adapted to be programmed by hard wiring and said plurality of signal pairs being representative of potential connecitvities in said electronic circuit structure.

4. A method for designing an electronic circuit structure, said electronic circuit structure having a layout comprising optional connectivities for hard wiring, said electronic circuit structure having a plurality of logical addresses, each of said logical addresses forming an assignment with one of a plurality of signal pairs, said method comprising the steps of
   a) establishing a mapping of said logical addresses to a layout of said electronic circuit structure, said mapping being generated in accordance with the steps of
      a1) establishing a first relation between said signal pairs and said layout, said relation being representative of an area of coincidence of said signal pairs on said layout;
      a2) establishing a second relation between said logical addresses and said signal pairs, said second relation being representative of said assignment of said logical addresses to said signal pairs; and
      a3) joining said first and second relations by using said signal pairs as keys;
   b) reading programming data representative of said hard wiring; and
   c) determining by means of said mapping said optional connectivities to be established.

5. An electronic device being implemented in an electronic circuit structure, said electronic circuit structure having a layout comprising optional connectivities for hard wiring, said electronic circuit structure having a plurality of logical addresses, each of said logical addresses forming an assignment with one of a plurality of signal pairs, said electronic device being produced in accordance with a method comprising the steps of
   a) designing a mask for said electronic circuit structure, said step of designing comprising the steps of
      a1) establishing a mapping of said logical addresses to a layout of said electronic circuit structure, said mapping being generated in accordance with the steps of
         a1.1) establishing a first relation between said signal pairs and said layout, said relation being representative of an area of coincidence of said signal pairs on said layout;

a1.2) establishing a second relation between said logical addresses and said signal pairs, said second relation being representative of said assignment of said logical addresses to said signal pairs; and a1.3) joining said first and second relations by using said signal pairs as keys;

a2) reading programming data representative of said hard wiring; and a3) determining by means of said mapping said optional connectivities to be established;

b) using said mask for implementing a sub set of said optional hard wired connectivities in said structure.

6. A method for testing of an electronic circuit structure, said electronic circuit structure having a plurality of logical addresses, each of said logical addresses forming an assignment with one of a plurality of signal pairs, said method comprising the steps of a) establishing a mapping of said logical addresses to a layout of said electronic circuit structure, said mapping being generated in accordance with the steps of a1) establishing a first relation between said signal pairs and said layout, said relation being representative of an area of coincidence of said signal pairs on said layout;

a2) establishing a second relation between said logical addresses and said signal pairs, said second relation being representative of said assignment of said logical addresses to said signal pairs, and a3) joining said first and second relations by using said signal pairs as keys;

b) testing said electronic circuit for a defective logical address;

c) determining said area of coincidence on said layout which corresponds to said defective logical address by means of said mapping.

* * * * *